United States Patent [19]

Delgadillo

[11] 4,091,125
[45] May 23, 1978

[54] CIRCUIT BOARD AND METHOD FOR PRODUCING SAME

[76] Inventor: Joseph A. Delgadillo, 16326 Burneston, Granada Hills, Calif. 91344

[21] Appl. No.: 739,608

[22] Filed: Nov. 8, 1976

[51] Int. Cl.² .................... B05D 5/12; B05D 1/32; B05D 3/02
[52] U.S. Cl. .................... 427/96; 156/153; 156/247; 156/250; 427/259; 427/386; 427/385 R; 427/409; 427/410
[58] Field of Search .................... 427/96, 98, 130, 131, 427/143, 154, 185, 197, 259, 282, 304, 305, 302, 289, 203, 370, 385 R, 386, 409, 410; 156/253, 261, 516, 153, 250, 247

[56] References Cited

U.S. PATENT DOCUMENTS

| | | | |
|---|---|---|---|
| 2,728,693 | 12/1955 | Cado | 427/96 |
| 3,467,540 | 9/1969 | Schick | 427/304 |
| 3,547,724 | 12/1970 | Zagusta | 156/253 X |
| 3,713,944 | 1/1973 | Dennis et al. | 156/261 X |
| 3,948,701 | 4/1976 | Fasbenber et al. | 156/253 X |
| 3,950,570 | 4/1976 | Kenny | 427/305 X |
| 4,012,552 | 3/1977 | Watts | 427/147 X |

Primary Examiner—George F. Lesmes
Assistant Examiner—R. Eugene Varndell, Jr

[57] ABSTRACT

There is disclosed a method for producing an electrical circuit board comprising the steps of selectively treating a portion of a conductive metal sheet in a pattern substantially corresponding to a predetermined printed circuit configuration and in a manner which renders the pattern portion of the sheet essentially adherent to a resin, placing the treated pattern portion of the sheet in direct contact with a layer of resin on the surface of an insulating substrate to form an assembly, uniformily heating the assembly to an elevated temperature to selectively bond the substrate to the treated pattern portion of the sheet, cutting the sheet along the perimeter of the pattern portions and stripping the non-pattern portions of the sheet from the substrate to form a circuit board.

15 Claims, 7 Drawing Figures

CIRCUIT BOARD AND METHOD FOR PRODUCING SAME

The present invention relates to the production of circuit boards and more particularly to a method for producing conductive electrical circuit patterns on an insulative substrate that eliminates the need for an etching process to remove non-pattern conductive areas.

In the field of fabricating electrical circuits on insulating substrates, it has been the general practice to employ an etching process, well known in the industry of producing printed circuit boards, in which unwanted portions of a sheet of copper are removed from a copper-clad laminate. In this process, an etching resist such as a photo-sensitive resist layer is applied to the surface of the copper. The resist is selectively exposed to a pattern of light to form a hardened pattern defining the desired circuit configuration. The background areas of unexposed photoresist may be removed by the etchant, thereby leaving the desired conductive circuit pattern.

Although etching processes have served the purpose, they have not proven entirely satisfactory under all conditions for the reasons that considerable difficulty has been experienced in reducing the cost of production, recovery of copper from the etchant chemicals and of disposal of the etchant chemicals. The etching process is not only expensive, but also time consuming. The process requires several sequential steps along with the consumption of photoresist and etchant chemicals. With a relatively thick layer of copper, large quantities of etchant chemical are required and large amounts of copper are removed into chemical solution. Furthermore, the disposal of relatively large quantities of spent etchant and recovery of copper from the etchant are expensive. The spent etchants are environmental pollutants and cause ecological damage unless the etchants are chemically treated before dispoal. Even with these limitations, the etching process still represents a widely used technique.

Another process in wide use is a so-called additive process in contrast with the substractive etchant process. In this process copper is applied in a pattern to an insulative substrate by electroless deposition.

This technique is also time consuming, expensive and difficult. It is difficult to apply the electroless layer to the substrate due to the non-uniformities in the surface of the substrate as supplied by various manufacturers. The additive process requires a large variety of chemical solutions and processing steps and also involves the treatment and disposal of the chemicals involved with add to the cost of the process and its ecological undesirability.

A more recent technique for making printed circuits, especially where a large number of identical circuits are required, is the "die stamping" method as described in Dennis, et al., U.S. Pat. No. 3,713,944. The manufacture comprises arranging an adhesive-free, electrically conductive sheet in over-lying relation with a nonconductive backing sheet coated with a dry, thermoplastic adhesive. A heated die having contours conforming generally to the configuration of conductive circuit elements to be bonded to the backing engages the conductive sheet and fuses the circuit elements to the backing sheet. The over-lying sheets then are indexed to a cutting station at which the sheets are supported on a hard, flat base and a cutting die having cutting edges corresponding to the marginal outlines of the circuit elements is dropped onto the over-lying sheets to cut the circuit elements from the conductive sheet. Following the cutting operation, the conductive sheet from which the circuit elements have been cut is removed and an over-lay sheet of insulation is applied over the circuit elements and bonded to the latter and to the backing sheet.

A more recent alternate method to the die-stamping process includes the forming of a laminate including a layer of metal conductor, an intermediate film of heat-curable adhesive and a fully cured substrate such as an epoxy-glass laminate. The desired circuit pattern is formed by applying a single heated die having the desired circuit configuration to the surface to simultaneously selectively bond the copper sheet to the surface and to punch out the circuit in the desired pattern. The unwanted portions of the cooper sheet are then removed since the punching operation only forms a weak bond with the non-pattered areas because of the limited area and time that the layer of adhesive is exposed to the heated punch die. After the non-patterned portions of the copper sheet are removed from the substrate, the assembly is returned to the press to completely cure the layer of adhesive to insure a strong bond between the printed circuit and the substrate.

The die-stamping methods both involve separate curing operations. First, the substrate is separately heated and cured and then the assembled board is separately cured to bond the circuit to the already cured substrate. Additionally, the die-stamping technique requires the use of a heated die to pretack the resin before cure. This technique is neither efficient nor reliable when utilized to apply relatively thick layers of copper.

The general purpose of this invention is to provide a method for producing electrical circuit boards which embraces all the advantages of similarly employed methods of making printed circuits and electrical circuit boards and possesses none of the aforedescribed disadvantages. To obtain this, the present invention contemplates selectively treating a conductive layer according to the conductive pattern of a circuit configuration such that only the circuit pattern areas will be bonded to an insulated substrate and the non-pattern areas may be cut away by a die stamp and removed whereby etching and selective heating are avoided.

It is therefore an objective of this invention to provide a simplified and low cost process for the production of electrical circuit boards.

Another object of the present invention is to provide a fast and simple production process for the repetitive production of large quantities of identical electrical circuit boards.

A further object of the present invention is to provide a method for producing electrical circuit boards in which separate resin curing steps are eliminated.

A yet further object of the present invention is to provide a process for the production of electrical circuit boards which eliminates the need for photo imaging, etching, and other chemical processing.

An additional object of the present invention is to provide an improved process for the manufacuture of electrical circuits which is simple, low cost and adaptable to mass production.

Other objects and many of the attendant advantages of this invention will be readily appreciated as the same becomes better understood by reference to the following detailed description when considered in connection with the accompanying drawings in which like reference numerals designate like parts throughout the figures thereof and where in:

Figure 1:
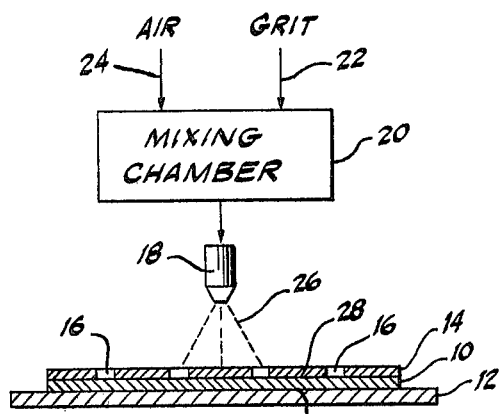
FIG. 1 is partly a block diagram and partly a cross-section view of the preliminary selective pattern treating process in accordance with the invention.

Referring now to the drawings wherein like reference characters designate like to corresponding parts throughout the several views, there is shown in FIG. 1 (which illustrates the preliminary pattern treating process in accordance with the invention) a conductive sheet of copper 10 positioned between a rigid support 12 and an abrasive resistant stencil or mask 14 having cut outs or openings 16 therein corresponding to a desired conductive circuit pattern or image. A nozzle 18 is located above mask 14 and is further connected to a mixing chamber 20 which is supplied with a source of fine grit 22 and a pressurized air supply 24. The air and grit are mixed within chamber 20 to form a pressurized dispersion which leaves nozzle 18 as a spray 26 and enters opening 16 in mask 14 and applies an abrading force to selectively treat a top surface 28 of sheet 10, a lower surface 34 of sheet 10 remaining untouched and untreated.

Figure 2:
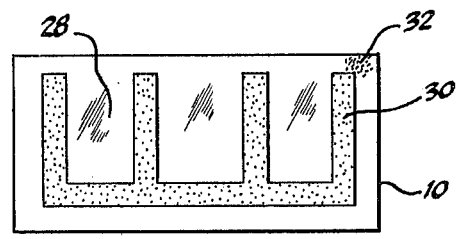
FIG. 2 is a view of the treated surface of the conductive sheet.

Turning now to FIG. 2, there is illustrated a selective mattelike pattern portion 30 formed on top surface 28 of conductive sheet 10 as a result of the honing treatment illustrated in FIG. 1. A lubricant or release coating 32 may be applied to the non-pattern or non-image portion of surface 28 such as by applying a negative mask (not shown) to sheet 10 and spraying release coating 32 onto surface 28.

Figure 3:
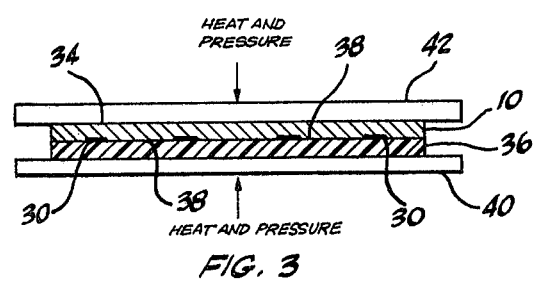
FIG. 3 is a partly schematic and partly cross-section view of the curing-adhesion step of the process of the invention.

FIG. 3 illustrates conductive sheet 10 applied to a resin impregnated substrate 36 wherein selectively treated surface 28 of sheet 10 is in contact with a resin coated surface 38 of substrate 36 and with untreated or top surface 34 of sheet 10 oppositely disposed therefrom. The assembly of copper sheet 10 and substrate board 36 are then positioned between press plates 40 and 42 or other rigid supports and inserted between heating platents of a press (not shown) to simultaneously cure the resin and adhere or bond the selected pattern portions of surface 28 of sheet 10 to surface 38 of substrate 36.

It should be noted that suitable release or barrier and cushioning layers of plastic and/or paper can be placed around the outside of the assembly of copper sheet 10 and substrate board 36 to insure uniformity of pressure and temperature during the curing and bonding step and to prevent liquid resin from falling onto and attaching to the contacting surfaces of the press. In one method of manufacture, pressure is applied when the temperature of the press plates and stacked assembly has attained a temperature at which the resin is softened and wets the pattern portions of surface 28 of sheet 10.

The temperature and pressure are maintained for an interval sufficiently to completely bond and cure the epoxy resin and adhere copper sheet 10 to surface 38 of substrate 36 to form a final laminate. After cooling, the edges of the laminate are trimmed and the laminate is ready for die punching or stamping.

Figure 4:
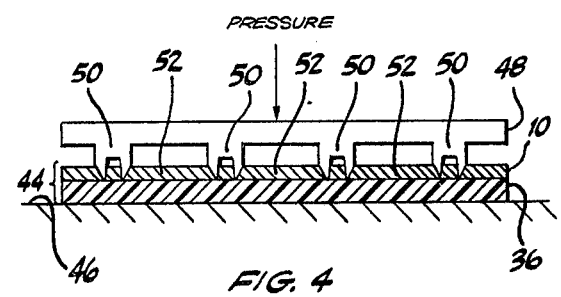
FIG. 4 is a partly schematic and partly cross-sectional view of the die-stamping step of the process of the invention.

Referring now to FIG. 4, the cured laminate assembly 44 comprising substrate 36 and copper sheet 10 is positioned on a rigid surface 46 and a die punch or stamp tool 48 having a configuration of cutting projections 50 arranged in a positive pattern to match the pattern portions of sheet 10 and having cutting edges sufficient to penetrate copper sheet 10 is applied to sheet 10 at a pressure and depth sufficient to completely sever non-adhering and non-pattern portions 52 of sheet 10 along the perimeter of the selected treated pattern portions thereof.

Figure 5:
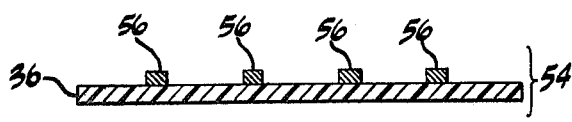
FIG. 5 is a cross-sectional view of the finished circuit board.
Figure 6:
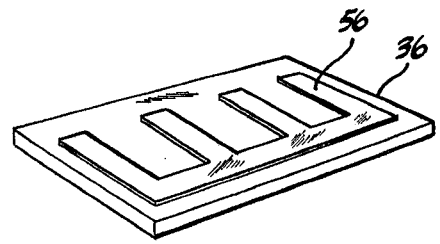
FIG. 6 is a perspective view of the finished circuit board of FIG. 5.

Turning now to FIGS. 5 and 6, the non-adherent or non-pattern portions 52 of sheet 10 are peeled away from substrate 36 to form a circuit board 54 with conducting elements 56 thereon corresponding to the selectively treated pattern portions of the conductive sheet.

Figure 7:
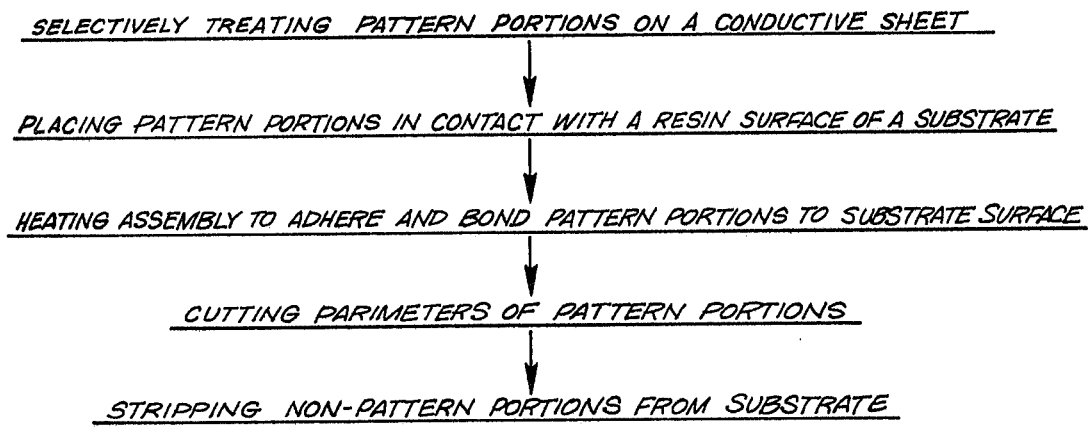
FIG. 7 shows the basic steps of the process of the invention.

In FIG. 7 the basic steps of the process are set forth, comprising selectively treated pattern portions on a conductive sheet; placing pattern portions in contact with a resin surface of a substrate; heating assembly to adhere and bond pattern portions to substrate surface; cutting perimeters of pattern portions; and removing non-pattern portions from substrate.

A description of the inventive process is best prefaced by discussing the construction of substrate 36. The substrate is a material capable of forming a rigid board having high volume resistivity, low dielectric constant and high dielectrical and mechanical strength. The substrate contains at least one surface layer of an organic resin which when placed in contact with an abrasively treated surface of a metal sheet and heated to elevated temperatures will soften, wet and flow into the depressions of the treated pattern area to form a bond. The strength of the bond is then increased by hardening the resin layer through curing.

Typically, the substrate will be formed by impregnating sheets of insulating materials such as glass, cloth or glass mat with the twostage prepolymer resin which can be advanced from a B-stage in which it behaves as a thermoplastic to a fully cured, rigid thermoset C-stage by heating the laminate to a cure temperature. Sufficient impregnating resin is utilized so that a surface layer is formed on the substrate for adhering to the treated metal circuit pattern. Suitable resins ae phenylformaldehyde novolak resins or polyesters or oxirane resins such as bisphenyl a-eipchlorohydrin based epoxy resins. These resins, when heated to a temperature below the curing temperature, that is within the B-stage range, assume a softened tacky condition capable of wetting and flowing into depressions of an abrasively treated or honed surface. When fully cured, these resins form a firm bond with such a suitably prepared surface.

The substrate can also be formed of a sheet of thermoplastic resin such as a polyamide such as nylon or a polyester such as Mylar. The softened resin sheet is hardened by cooling the layer to below melting or softening temperature.

It should be noted that many types and sizes of B-stage prepreg laminates or thermoplastic sheets or films suitable for making circuit boards are readily available commercially in various thicknesses and dimensions. Large sheets can be cut to size of individual boards before proceeding with the process of the invention or multiple circuits can be formed on a single board and cut into individual boards after applying circuits in accordance with the process of the invention. The number of layers of impregnated glass cloths is not critical, the essential criteria being that the fully cured board have mechanical strength and dimensional stability suitable for its intended use.

Turning now to the conductive metal sheet 10 for forming the electrical circuit, sheet 10 is suitably made of copper or other conductive metal such as aluminum, silver, gold or platinum. The thickness of the sheet may be typically from 0.25 mils to 40 mils and should be conformed in size to the substrate board. A surface of the conductive metal sheet is then treated to render a portion of its surface more adherent to the resin of the substrate in a pattern coincident to the desired finished electrical conductive circuit.

The circuit pattern treating techniques are next discussed before describing the operative method of the invention. It should be noted that the circuit pattern area may be treated or applied by hand brushing or painting techniques. However, it is preferred to apply a negative stencil or mask 14 to the surface of the metal sheet 10 having openings 16 in the pattern of the desired electrical circuit as shown in FIG. 1. Selectively adherent surface 30 on sheet 10 is formed by roughening the surface preferably in a manner to form sharply raised contours which will provide a strong bite for the softened resin. In the case of reactive roughening liquid such as copper etchants or copper additive materials, whether of an electroless of electrolytic nature, it will be necessary to apply a firmly bonded resist to the surface to localize the action of these materials. Such resists can be of the chem-mill type in which a solution elastomer is applied to the surface and dried to form a peelable adherent film and the circuit pattern then is removed by cutting and peeling the material from the surface. Other resists which are actinically curable can be applied to the surface of the copper sheet, exposed to a positive mask to harden the background areas and the circuit pattern image removed with suitable developing solvents preliminary to the roughening treatment.

Chemical roughening of the resist pattern covered copper sheet can be effected by etchant solutions containing acids such as $H_2SO_4$ or HCl or salts such as $FeCl_3$ or by an electrolytic etch bath such as 70% by volume HCl at 80° C in which the sheet is connected as an anode in the presence of a graphite cathode at a current density of 60 amps per square foot. Other details of this electrolytic etch process are disclosed in U.S. Pat. No. 3,518,168. A suitable electroless copper addition bath is described in U.S. Pat. No. 3,512,946, and a suitable copper electrolytic bath forming a roughening treatment is described in U.S. Pat. No. 3,293,109.

The selective treated or roughened pattern portion on sheet 10 may also be formed by mechanical action such by contacting the surface with an abrasive or abrading agent with a hand or motor-driven abrading tool. A preferred manner of forming the roughened surface pattern in accordance with the invention is by honing or peening in which a dispersion of particulate abrasive in an inert fluid carrier such as air or water is selectively applied to the surface of sheet 10 as illustrated in FIG. 1 to form a roughened surface portion having sharp edges such that the pattern forms a matte-like surface in appearance as contrasted with the smooth, reflective, non-treated portions of the sheet.

The honing or peening process has many advantages since the treatment materials are inert with respect to the copper substrate, and the mask or stencil need not be adherent to the surface but may take the form of a stencil formed out of strong, abrasive resistant material such as metal. Furthermore, there is the absence of the active chemical byproducts and all the spent grit or abrasive is simply collected and recycled to the applicator for reuse. The abrasived may be finely divided grit material such as $Al_2O_3$, glass beads or sand, and the like.

The concentration of the grit in the fluidizing carrier, and the pressure and time of application depend on the thickness of the copper sheet and the degree of sharp edges or bite desired. Honing is preferably conducted in a manner in which no metal removal occurs but rather the surface is dented to form sharply defined depressions and protuberances rather than rounded edges to maximize the bond to the resin. With very thin sheets of copper, it is preferable to provide a rigid backing such as steel plate during the honing treatment, to support the sheet. After the honed pattern is formed the metal stencil is removed.

It should also be noted that the metal sheet may be selectively oxidized by the method described in U.S. Pat. No. 2,364,993, and U.S. Pat. No. 2,997,521 to form a coating of black copper oxide in a pattern coincident with the desired electrical circuit. The black cupric oxide coating produced in this or in an equivalent manner may be characterized briefly as an adherent coating, being effectively integral with the underlying copper and is sharply to be distinguished from an oxide coating that has little adhesion to the copper and readily flakes away. Therefore, it is possible to obtain a strong bond between the resin coated substrate and selected portions of the copper sheet because of the adherent cupric oxide coating which is not weakened by repeated flexure. The copper oxide surface is somewhat rough being composed of the contours of crystals of which it is composed and, therefore, forms a surface easily bonded to a resin or thermoplastic substrate.

Optionally, the non-pattern portions of sheet 10 or the background areas may be coated with a release or parting agent 32 illustrated in FIG. 2 such as a liquid wax or solid fluorocarbon resin to minimize attachment of the substrate to the non-pattern or non-circuit areas of the copper sheet. The surface of the metal sheet may be first completely roughened and the release agent selectively applied to the background through screens or masks. A liquid release agent may be applied through a mask or stencil to the background or a solid sheet or film of solid release agent can be molded or cut to the desired pattern and registered over the background areas before applying the treated metal sheet to the substrate. In the latter technique, soften resin would be forced up against the sheet in an amount equal to the thickness of the release stencil which would enhance the die-stamping characteristics.

Another alternate procedure is to apply a film of liquid release agent over the total surface of the metal sheet 10 and then selectively roughen the coated sheet such as by honing through a stencil to simultaneously roughen and remove the release agent from the desired circuit pattern portions of the metal sheet.

Now directing the disclosure to the process of the present invention, the preferred starting materials are a sheet of conductive material such as copper and a substrate containing a continuous surface layer of resin such as the usual B-stage prepreg as set forth hereinbefore. However, instead of applying either a layer of adhesive or pattern of adhesive to the surface of the copper sheet, the surface of the copper sheet is selectively treated as described hereinabove in a pattern corresponding to the proposed circuit configuration to render the treated area more adherent to the B-stage prepreg.

This treatment can include roughening the surface in the pattern area portion by chemical or mechanical treatment and can involve material addition or material subtraction. Optionally, a release agent may also be applied to the non-circuit pattern areas to further limit adherence of the substrate to those areas.

The treated surface of the copper sheet is then placed in intimate contact with the prepreg substrate and the assembly is uniformly heated to elevated temperatures in the conventional fashion as by a hot pressing procedure. The layer of B-stage resin on the surface prepreg will wet out and will form a firm bond with the treated area of the copper sheet. However, the untreated, non-pattern areas of the copper sheet will only form a weak bond with the prepreg material during the curing process.

Consequently, after the curing process, the sheet can be die punched in the circuit pattern configuration and the unwanted areas of the conductive sheet simply stripped away mechanically and reclaimed for salvage or reuse.

The process of the present invention requires only a single heating operation, eliminates the need for separate adhesive, a heated die, a 2-step cure, and results in the simultaneous adherence of the pattern and curing of the substrate board. The process need not involve the use of aggressive chemicals nor the hazards and by-products involved therewith and is adapted to high speed, automated repetitive operation.

It now should be apparent that the present invention provides a process for selectively adhering portions of a conductive sheet to an insulating substrate which may be employed in conjunction with the fabrication and production of electrical circuit boards.

Although particular steps, components, etc., have been discussed in connection with a specific embodiment of a method of circuit board construction in accordance with the teachings of the present invention, others may be utilized. Furthermore, it will be understood that although an exemplary embodiment of the present invention has been described, disclosed and discussed, other applications and process arrangements are possible and that the embodiments disclosed may be subjected to various changes, modifications, and substitutions without departing from the spirit of the invention.

What is claimed is:

1. A process for producing an electrical circuit board comprising the steps of:
    selectively roughening a portion of the surface of a conductive metal sheet in a pattern substantially corresponding to a pre-determined conductive circuit configuration which roughened surfaces renders the pattern portion essentially adherent to a resin;
    placing the roughened pattern portion of the metal sheet in direct contact with a uniform layer of resin on the surface of an insulating substrate to form an assembly;
    heating the assembly to an elevated temperature to soften the resin such that the resin wets and adheres to the roughened pattern portion of the metal sheet whereby the substrate is selectively bonded to the roughened pattern portion of the metal sheet;
    punch cutting the sheet along the perimeter of the pattern portions; and
    stripping the non-pattern portions of the metal sheet from the substrate to form a conductive circuit board.

2. The process described in claim 1 in which the metal sheet is a film of copper.

3. The process described in claim 1 in which the resin comprises a film of thermoplastic resin and which further includes the step of cooling the thermoplastic below softening temperature before the cutting step.

4. The process described in claim 1 in which the resin comprises a layer of uncured thermosetting resin on the surface of the substrate.

5. The process described in claim 4 in which the substrate comprises a fiber reinforced prepreg impregnated with resin in addition to the layer of resin on the surface of the substrate.

6. A process described in claim 5 in which the assembly is heated to a temperature above the curing temperature of the resin.

7. The process described in claim 6 in which the substrate comprises a plurality of layers of glass fabric impregnated with epoxy resin.

8. The process described in claim 1 in which the step of selectively roughening employs a honing process.

9. The process described in claim 8 further including the step of applying a liquid release agent to the complete surface of the sheet prior to the selective treating step.

10. The process described in claim 8 in which the punch cutting step is conducted by applying a cold cutting die tool to the perimeter of the pattern portions of the surface of the copper sheet.

11. The process described in claim 8 in which the honing process comprises the application of a dispersion of finely-divided abrasive particles in a fluid carrier to the pattern portions of the surface of the copper sheet.

12. The process described in claim 11 in which a mask having a positive opening in the configuration of the pattern portions is interposed between the surface of the metal sheet and the dispersion of abrasive particles during the roughening process.

13. The process described in claim 8 further including the step of applying a release agent to the non-pattern portions of the copper sheet prior to the placing step.

14. The process described in claim 13 further including the step of roughening the entire surface of the copper sheet prior to the step of applying the release agent to the non-pattern areas.

15. The process described in claim 13 in which the release agent is in the form of a solid sheet having an opening pattern in the form of the pattern portions of the copper sheet.

* * * * *